United States Patent
Yen et al.

(10) Patent No.: US 9,331,624 B2
(45) Date of Patent: May 3, 2016

(54) THRUST RIPPLE MAPPING SYSTEM IN A PRECISION STAGE AND METHOD THEREOF

(71) Applicant: National Taiwan University, Taipei (TW)

(72) Inventors: Jia-yush Yen, Taipei (TW); Fu-tsun Kuo, Taipei (TW); Craig Western, Peachtree City, GA (US)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 422 days.

(21) Appl. No.: 13/775,813

(22) Filed: Feb. 25, 2013

(65) Prior Publication Data

US 2014/0239855 A1   Aug. 28, 2014

(51) Int. Cl.
| H02K 41/00 | (2006.01) |
| G03B 27/58 | (2006.01) |
| H02P 25/06 | (2016.01) |
| H02P 8/00 | (2006.01) |
| H02P 8/40 | (2006.01) |
| G03F 7/20 | (2006.01) |

(52) U.S. Cl.
CPC ............. *H02P 25/06* (2013.01); *H02P 8/005* (2013.01); *H02P 8/40* (2013.01); *G03F 7/70716* (2013.01); *G03F 7/70725* (2013.01)

(58) Field of Classification Search
CPC . G03F 7/70716; G03F 7/70725; H02P 25/06; H02P 8/005; H02P 8/40
USPC ............. 74/490.07, 490.09; 701/37; 318/135; 355/72
See application file for complete search history.

(56) References Cited

U.S. PATENT DOCUMENTS

| 4,654,571 A | * | 3/1987 | Hinds ................. G03F 7/70716 318/640 |
| 4,742,286 A | * | 5/1988 | Phillips ........................ 318/640 |
| 5,623,853 A | * | 4/1997 | Novak ............... G03F 7/70358 355/53 |
| 8,102,501 B2 | * | 1/2012 | Coon et al. ..................... 355/30 |
| 2002/0070699 A1 | * | 6/2002 | Tanaka et al. ................. 318/687 |
| 2005/0248744 A1 | * | 11/2005 | Shibazaki .......... G03F 7/70716 355/72 |
| 2011/0029197 A1 | * | 2/2011 | Uenuma .............. B60G 17/005 701/37 |

OTHER PUBLICATIONS

Fu-Tsun Kuo et al.; "Development of a System for Mapping of Thrust Ripple Induced by PMLSM Drives in a Single-Deck, Dual-Axis Precision Stage"; 7 pages; Department of Mechanical Engineering National Taiwan University; May 24-26, 2012; 13th International Conference on Optimization of Electrical and Electronic Equipment, Brasov, Romania.

* cited by examiner

*Primary Examiner* — Bentsu Ro
*Assistant Examiner* — Zemenay Truneh
(74) *Attorney, Agent, or Firm* — Hauptman Ham, LLP

(57) ABSTRACT

The present invention proposes a thrust ripple mapping system in a precision stage with the thrust ripple mapping system comprising a moving stage, a load cell, a plurality of motors and a processing component. The load cell is coupled to the moving stage. The motors are employed in moving the load cell and the moving stage. The processing component takes a thrust force measurement at each of a plurality of moving increments of the load cell.

6 Claims, 15 Drawing Sheets

THRUST RIPPLE MAPPING SYSTEM IN A PRECISION STAGE AND METHOD THEREOF

CROSS-REFERENCE

This invention is partly disclosed in a thesis entitled "Development of a System for Mapping of Thrust Ripple Induced by PMLSM Drives in a Single-Deck, Dual-Axis Precision Stage" on May 24-26, 2012 completed by Fu-Tsun Kuo, Craig Western and Jia-Yush Yen.

FIELD OF THE INVENTION

The present invention relates to a thrust ripple mapping system in a precision stage and method thereof and more particularly relates to a thrust ripple mapping system in a precision stage and method thereof for thrust force compensation.

BACKGROUND OF THE INVENTION

Precision stages are becoming increasingly important in industrial applications, such as semiconductor fabrication, precision manufacturing, machine tools, lithography, and scanning probe microscopes. Stage accuracy to the micrometer and even nanometer scale is quickly becoming the standard in a number of the above-mentioned industries. To overcome the friction inherent in conventional stage designs involving rotation motors and lead screws, linear motors are increasingly being used as stage drive mechanisms. Additionally, advances in technology have led to an interest in planar stages for replacing conventional two-layer biaxial systems in order to minimize friction, spatial requirements, and other unwanted effects such as Abbe error (also called sine error, which indicates the magnification of an angular error over a distance).

Use of linear motors, however, introduces thrust ripple that arises from unwanted variations in an input current, a cogging force, or imperfections in the coils within the motors and other sources. Recent research has aimed to identify and overcome thrust ripple in permanent magnet linear synchronous motors (PMLSMs) and similar hardware through development of such techniques as an adaptive sliding control for thrust ripple compensation, the application of a position-dependent compensation term in the control algorithm, improvement in motor hardware design and magnetic field analysis using the equivalent magnetizing current method, the application of repetitive control, and variations of additional hardware parameters such as magnet size.

However, the above-mentioned research requires a system and method to measure thrust ripple precisely in a two-axis precision stage so as to achieve thrust ripple compensation.

SUMMARY OF THE INVENTION

The main object of the present invention is to provide a thrust ripple mapping method for compensating a thrust force in a precision stage.

According to the main object mentioned above, a thrust ripple mapping method in a precision stage is disclosed in the present invention, and the thrust ripple is induced by a motor. The thrust ripple mapping method comprises steps of: defining a moving distance of a load cell having the motor and a plurality of moving increments within the moving distance; measuring a thrust force of the load cell at each of the moving increments of a horizontal direction and/or a vertical direction within the moving distance; plotting a diagram illustrating a measured result of the thrust force in the horizontal direction and/or the vertical direction within the moving distance; and mapping a plurality of thrust ripples in accordance with the diagram of the measured result of the thrust force.

Another object of the present invention is to provide a thrust ripple mapping method for compensating a thrust force in a two-axis precision stage.

According to the object mentioned above, a thrust ripple mapping method in a two-axis precision stage is disclosed in the present invention and the thrust ripple is induced by a motor. The thrust ripple mapping method comprises steps of: defining a moving distance of a load cell having the motor and a plurality of moving increments within the moving distance; determining to move the load cell forward or backward with respect to a reference point; measuring a thrust force at each of the moving increments in a horizontal direction by restricting motion in a vertical direction within the moving distance; measuring the thrust force at each of the moving increments in the vertical direction by restricting motion in the horizontal direction within the moving distance; plotting a diagram illustrating a result of the thrust force in the horizontal direction and the vertical direction; and mapping a plurality of thrust ripples in accordance with the diagram of the measured result of the thrust force.

Another object of the present invention is to provide a thrust ripple mapping system to measure a thrust force in a vertical direction and/or a horizontal direction so as to map the thrust ripple.

According to the object above, a thrust ripple mapping system in a precision stage is disclosed in the present invention and the thrust ripple is induced by a motor. The thrust ripple mapping system comprises a moving stage, a load cell, a plurality of motors and a processing component. The load cell is coupled to the moving stage. The motors are employed in moving the load cell and the moving stage. The processing component takes a thrust force measurement in each of a plurality of moving increments of a moving distance with respect to the load cell.

The above-mentioned description of the present invention can be best understood by referring to the following detailed description of the preferred embodiments and the accompanying drawings.

DETAILED DESCRIPTION OF THE PREFERRED EMBODIMENTS

In the following detailed description of the preferred embodiments, reference is made to the accompanying drawings which form a part hereof, and as shown by way of illustration specific embodiments in which the invention may be practiced. In this regard, directional terminology, such as "top," "bottom," "front," "back," "left," "right," "inside," "outside," "side," etc., is used with reference to the orientation of the Figure(s) being described. As such, the directional terminology is used for purposes of illustration and is in no way limiting the present invention.

Figure 1:
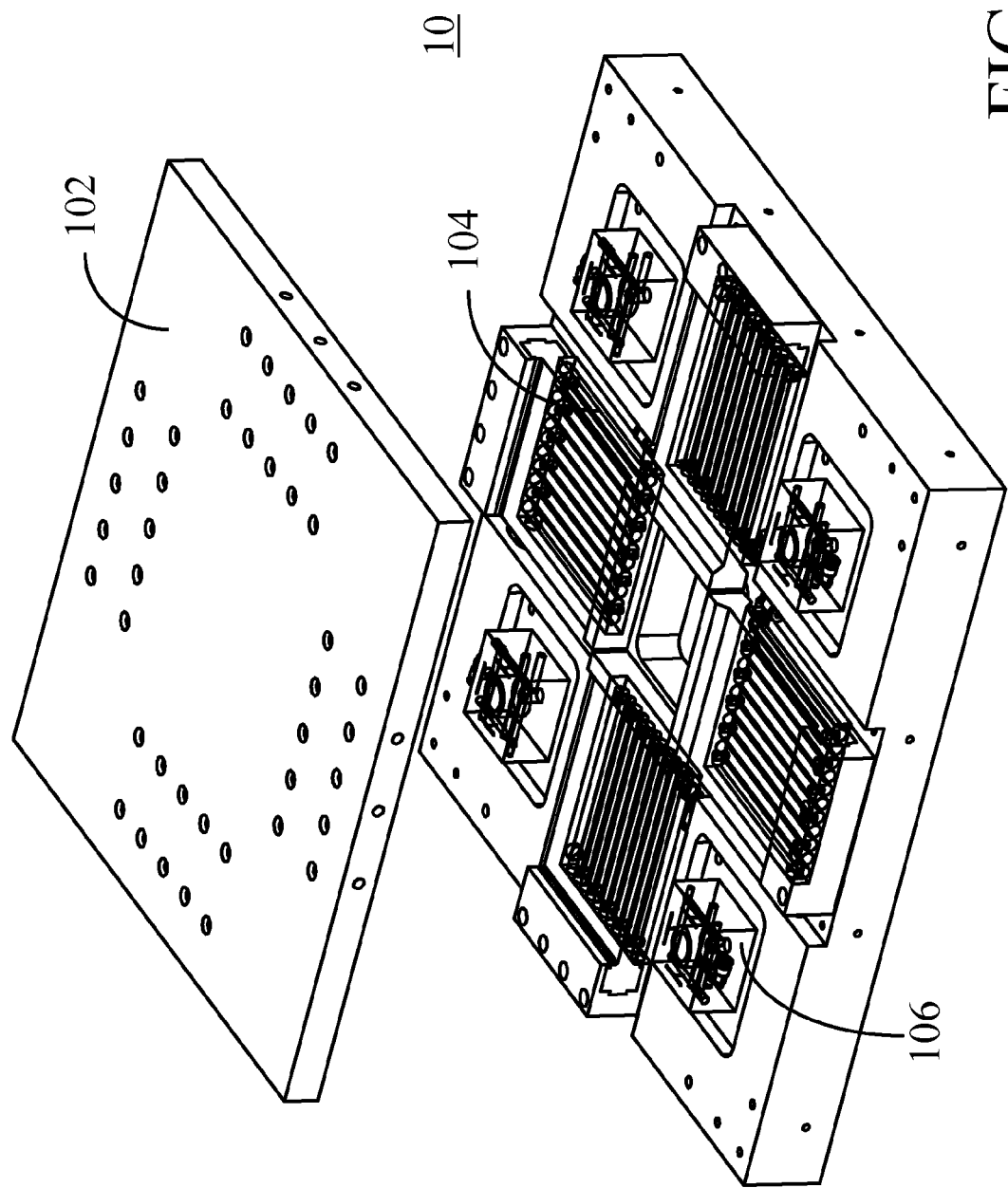
FIG. 1 is a view illustrating a precision stage for measuring thrust ripples in one embodiment of the present invention.

FIG. 1 is a view illustrating a precision stage for measuring thrust ripples in one embodiment of the present invention. As shown in FIG. 1, a precision stage 10 includes a moving stage 102, four linear motors 104 and four air bearings 106. In the present embodiment, the moving stage 102 can measure 400 by 400 millimeters, and weighs 9.31 kilograms. However, in a different embodiment, the moving stage 102 of the present invention can be used to measure different areas and different weights, and it is not limited thereto. The linear motors 104 can operate in pairs along the x- and y-axes of the moving stage 102. The air bearings 106 can produce an air gap of approximately 8 micrometers. Also, the number of linear motors 104 and the air bearings 106 in the present invention can be varied in accordance with the practical requirement, and it is not limited thereto. The linear motors 104 in the present invention are preferred to be PMLSMs. The moving stage 102 has an overall range of motion which is 50 by 50 millimeters.

Still referring to FIG. 1, a driving force in the moving stage 102 is limited by the current applied to the linear motors 104; consequently, a higher speed and acceleration are achieved by reducing the weight of the moving stage 102. Given these design constraints, stage hardware was optimized by using finite element analysis software, and deflection of the resulting design is limited to 2 micrometers or less, taking additional loading forces of 0.5 kilograms into consideration. The four linear motors 104 are also designed by finite element analysis software. Dimensions have been optimized to satisfy spatial and structural constraints, to maximize thrust forces, and to minimize force ripples.

Figure 2:
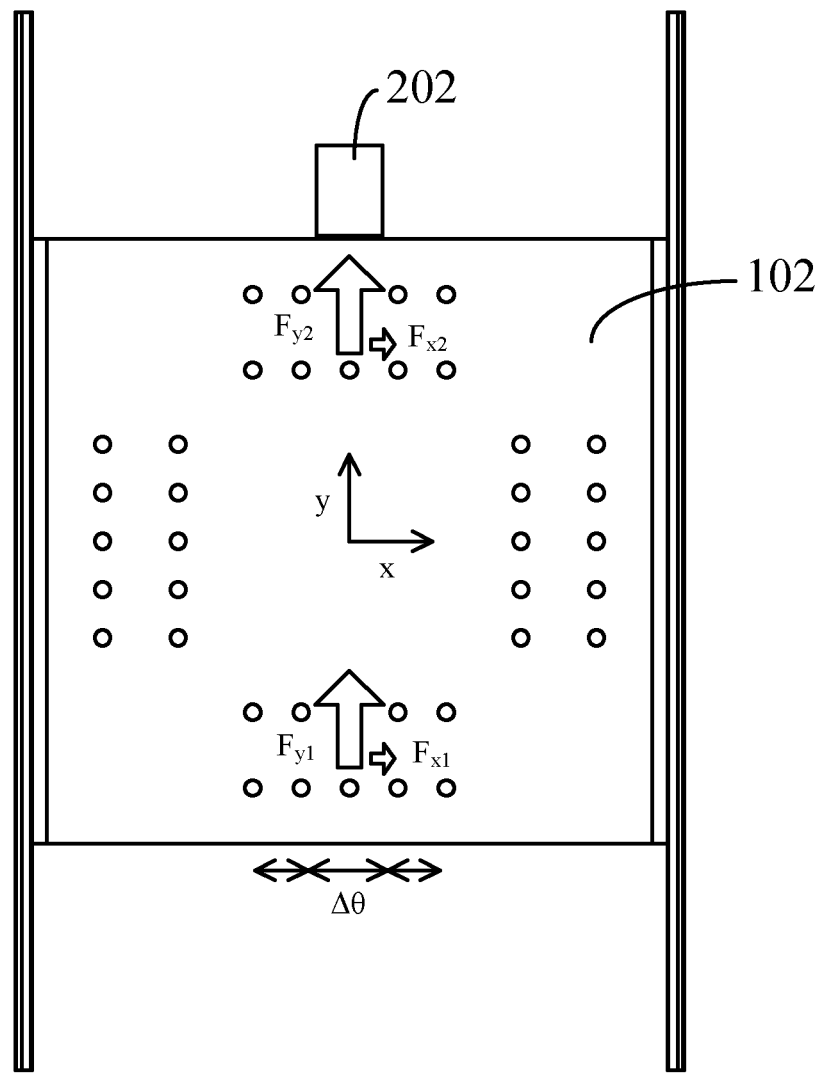
FIG. 2 is a schematic view illustrating motor forces in a vertical direction and disturbances in horizontal direction.

In measuring thrust ripples over a range of travel of the moving stage, a planar motion can be (1) movement in the x-direction by restricting motions in a y-direction and (2) movement in the y-direction by restricting motions in the x-direction, respectively. A schematic view is shown in FIG. 2. This arrangement allows thrust, specifically continuous force on the load cell, in the x-direction (the horizontal direction) and y-direction (the vertical direction) to be measured independently with respect to a planar position and a target q-axis current magnitude.

Please refer to FIG. 1 and FIG. 2 in conjunction. In measuring force on the load cell in the y-direction as illustrated in FIG. 2, for example, motion in the x-direction was restricted. This was achieved both by directing current only to motors oriented in the y-direction to produce forces $F_{y1}$ and $F_{y2}$ and by implementing linear guidelines to physically constrain unwanted x-axis motions due to small disturbances $F_{x1}$ and $F_{x2}$. A load cell 202 was placed against one of the two unrestricted edges, its axis of measurement oriented in the y-direction. Stepper motors were employed in moving the stage, constraints, and the load cell 202 in increments $\Delta x$ along the entire range of motion in the x-direction, taking a motor thrust measurement in each increment. At the completion of an x-row of data points, an additional stepper motor was used to move the load cell 202 one increment $\Delta y$ in the y-direction such that the process could be repeated, ultimately resulting in y-oriented thrust measurements at equally spaced increments over the entire range of travel. A program was written to automate the entire process, allowing the measurement of an entire plane of points with variable length, width, and spacing from start to finish with no user intervention. In order to measure force on the load cell 202 in the x-direction, the hardware was reoriented to restrict motion in the y-direction. Plotting measured thrust forces over the full plane of motion allowed straightforward identification of thrust ripples in an x-direction and a y-direction as measured thrust varied with position.

Figure 3A:
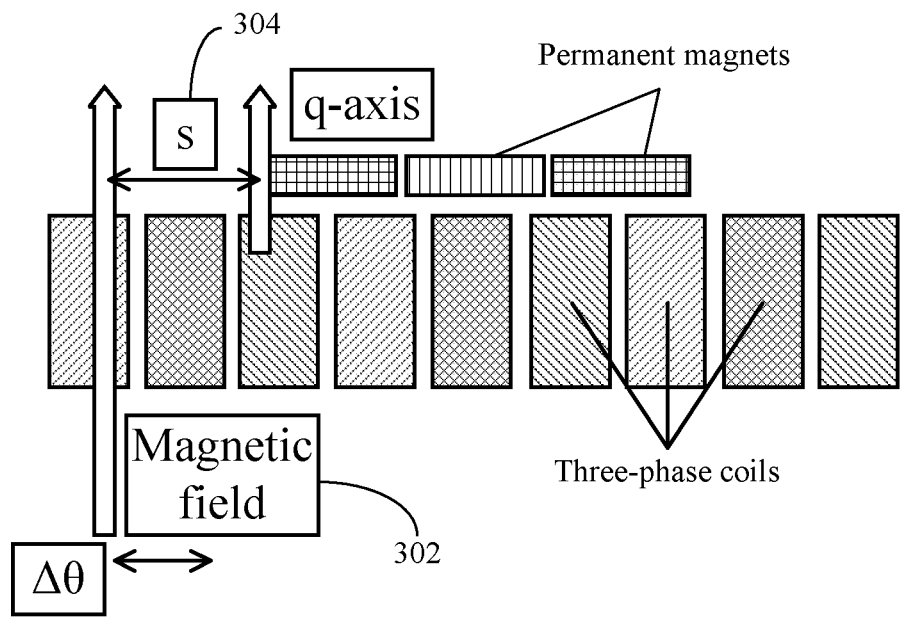
FIGS. 3A and 3B are views illustrating displacements between induced magnetic field and q-axis before and after incrementing the setup by one unit $\Delta\theta$.
Figure 3B:
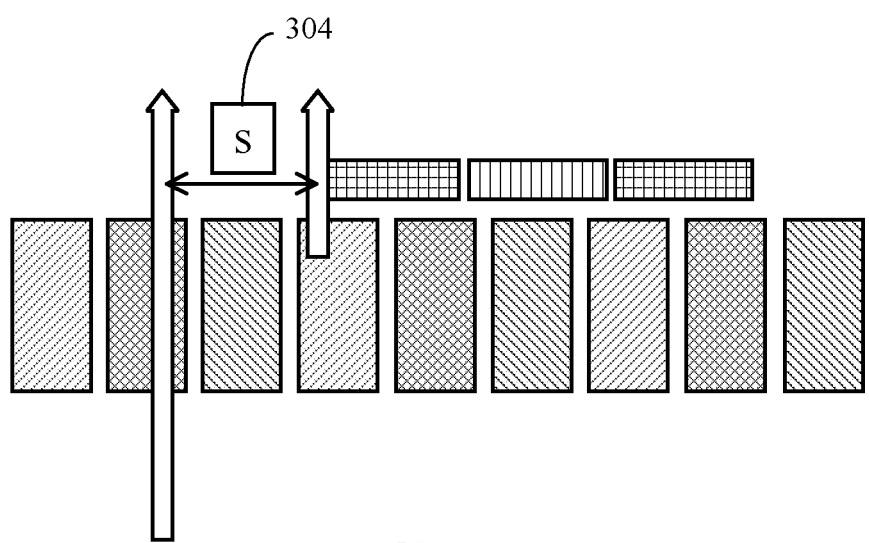

FIG. 3A and FIG. 3B are views illustrating thrust force measured in one embodiment of the present invention. As shown in FIG. 3A and FIG. 3B, a position of the induced magnetic field 302 in the abc-frame for a target input current was first aligned with q-axis position vector q at an initial position within the range of travel. This was achieved by allowing the stage to align freely along the direction of motion with the given current input. This position was used to place and orient the load cell by lightly touching the load cell to the edge of the stage. Magnetic field 302 was then induced at a position that directed stage motion into the load cell, resulting in an unknown displacement 304 between the magnetic field 302 in the abc-frame and the q-axis as shown in FIG. 3A. The abc-frame and the q-axis are adopted to achieve control of the power. Displacement s 304 produced force on the load cell. An electric angle $\theta$ equal to one fourth of the 32-millimeter motor coil pitch was used in approximating the location of the magnetic field 302 in order to maximize magnetic attraction between the magnetic field 302 and the q-axis for a given input current magnitude. In performing the experiment, the magnetic field 302 and its corresponding transformed q-axis were varied in increments calculated to correspond with variations $\Delta x$ and $\Delta y$ in a planar position of the load cell and stage. In this experiment, $\Delta x$ and $\Delta y$ were both set equal to an increment in the electric angle $\Delta\theta$. Although the displacement s 304 and actual q-axis current could not be measured directly, inputting the ideal current calculated using constant $\Delta\theta$ for each position allowed observation of variation in thrust force over the range of motion. With no thrust ripples, calculated input currents and the corresponding magnetic field 302 would produce a constant thrust over the plane of motion. Discrepancies in measured thrust, then, were guaranteed to be caused by variations in the electromagnetic field over the range of motion that represents thrust ripples. Plotting these discrepancies produced a direct mapping of thrust ripples over the range of the planar stage.

Figure 4:
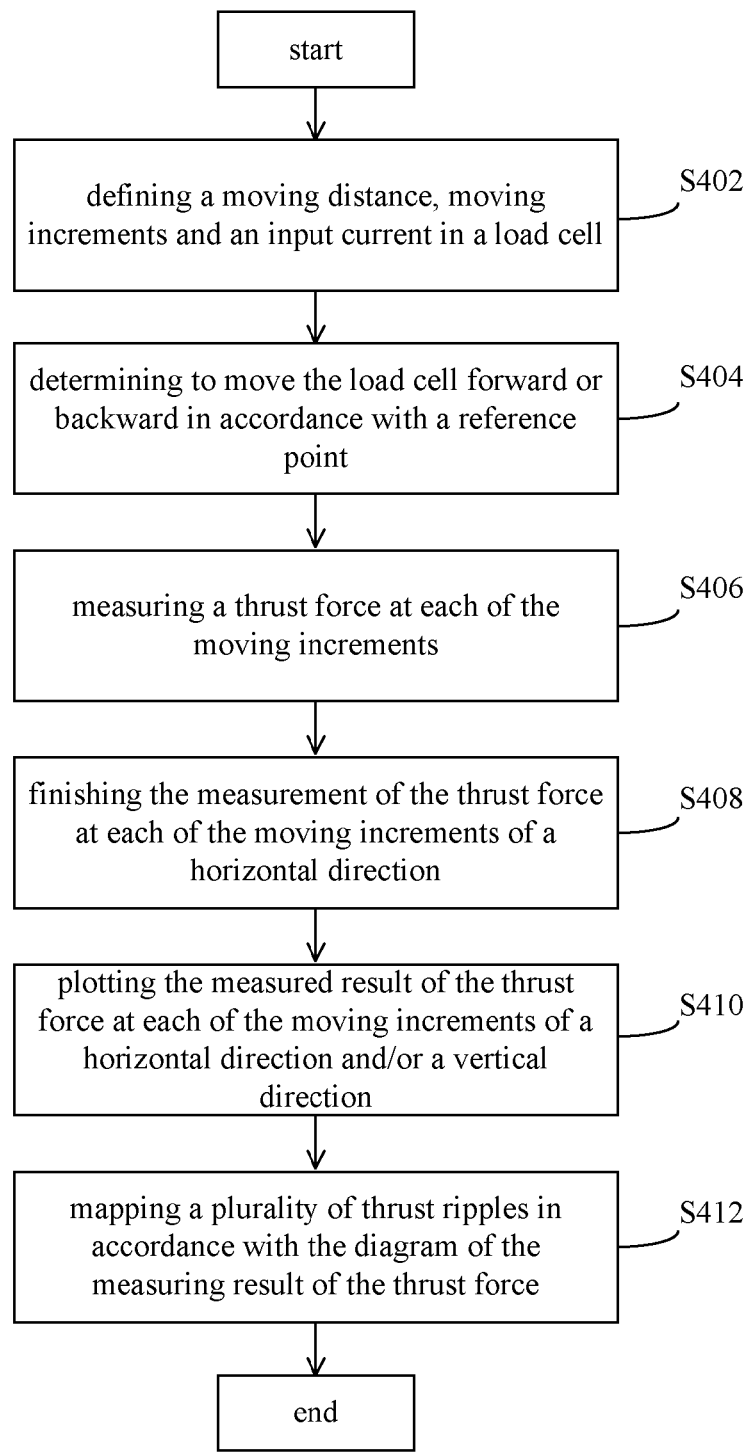
FIG. 4 is a flow chart illustrating a thrust ripple mapping method in one embodiment of the present invention.

FIG. 4 is a flow chart illustrating a thrust ripple mapping method in one embodiment of the present invention. As shown in FIG. 4, in step S402, a user defines a moving distance, moving increments and an input current in a load cell. If the thrust ripple is measured in a two-axis precision stage, two linear guides are used to limit the motion of the moving stage in the embodiment of the present invention. In step S404, the load cell is determined to move forward or backward in accordance with a reference point. In step S406, a thrust force at each of the moving increments is measured. In step S408, the measurement of the thrust force at each of the moving increments of a horizontal direction and/or a vertical direction is finished. In step S410, a diagram illustrating a measured result of the thrust force in the horizontal direction and/or the vertical direction is plotted. In step S412, a plurality of thrust ripples in accordance with the diagram of the measured result of the thrust force are mapped. According to the method described above, a thrust ripple was observed by measuring thrust force over the range of motion, and the thrust force can be compensated in accordance with the mapped result of the thrust ripples.

Figure 5:
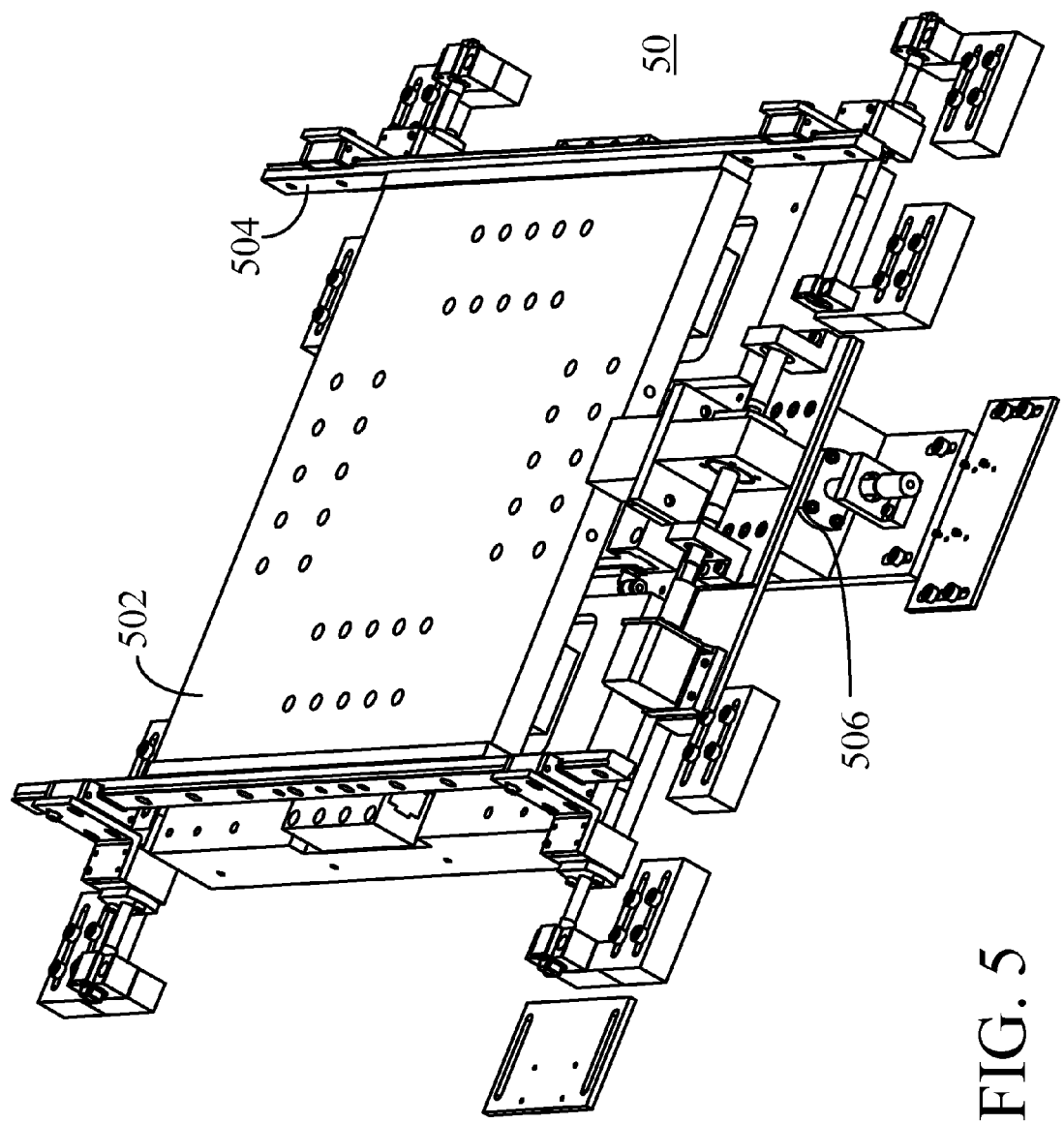
FIG. 5 is a view illustrating a hardware design of the precision stage in the preferred embodiment of the present invention.

Hardware setup of a precision stage 50 is shown in FIG. 5. Low-friction linear guides 504 were employed in restricting the stage 502 motion to one dimension, maintaining the stage's 50-millimeter travel range in the unconstrained direction, and structural support was designed to minimize deflection in the direction perpendicular to travel. Ball screws were installed that allowed the stage and linear guides to move a minimum of ±25 millimeters from center in the direction perpendicular to stage travel, such that the stage's initial position could be anywhere within its 50 by 50 millimeter operating range. Finally, a xy-traverse system with 50 by 50 millimeter minimum motion range was designed to support the load cell 506 and implemented such that the load cell 506 would coincide with the center of the stage's leading edge of travel, minimizing torque on the stage and on the system. The load cell is configured to measure up to 200 pounds of force. In the present embodiment, six stepper motors were mounted: four of them for controlling position at each end at each of the two linear guides, and two of them to control each direction of the motion of the load cell. Two digital-to-analog Adlink PCI-6208V cards with 16-bit resolution voltage output were used to send input commands to the stepper motors and to send current commands to the driver of the linear motors in applying continuous force. The linear motor driver used in this system was a current amplifier used to regulate the current of each phase of the coil to the current command. An Adlink PCI-9114 analog-to-digital card with 16-bit resolution voltage output was used to measure analog output indicating force on the load cell while collecting data over the plane of motion. Control software was written in C programming that would allow users to vary the number of increments over the range of travel in x and y; increment size; and input current to the linear motors.

Two types of experiments were performed. In the first type, motor thrust data representing continuous force on the load cell were collected over a 30 millimeter by 30 millimeter plane in $\Delta\theta$ increments of 1.0 millimeters, resulting in a total of over 900 data points over the plane. Force on the load cell was calculated by taking the difference between measured load for the given target q-axis input current and measured load for a small constant preload, used to close any gaps between the stage and the sensor. At each point, 100 samples were averaged to yield the thrust measurement. Multiple trials were taken with different starting points within the 50 by 50 millimeter range of travel, and target q-axis input current magnitude was varied between 1.2 and 2.4 amps. The process was carried out for x-direction and y-direction.

The second experiment was performed in order to obtain a higher-resolution profile of the observed thrust ripples in the direction of motion without the time requirement necessary in significantly increasing resolution in two dimensions. Motor position was varied only in the unconstrained direction over a span of 30 millimeters at intervals of 0.05 millimeters and thrust was calculated using the same method. This procedure was repeated for a total of three trials, all of which began and ended at the same coordinates in the direction of motion. In the direction perpendicular to the motion, however, the starting and ending points were offset by 5 millimeters in order to yield three cross-sectional profiles of the thrust ripples along the same range of motion. The process was carried out for both x-direction and y-direction.

Figure 6A:
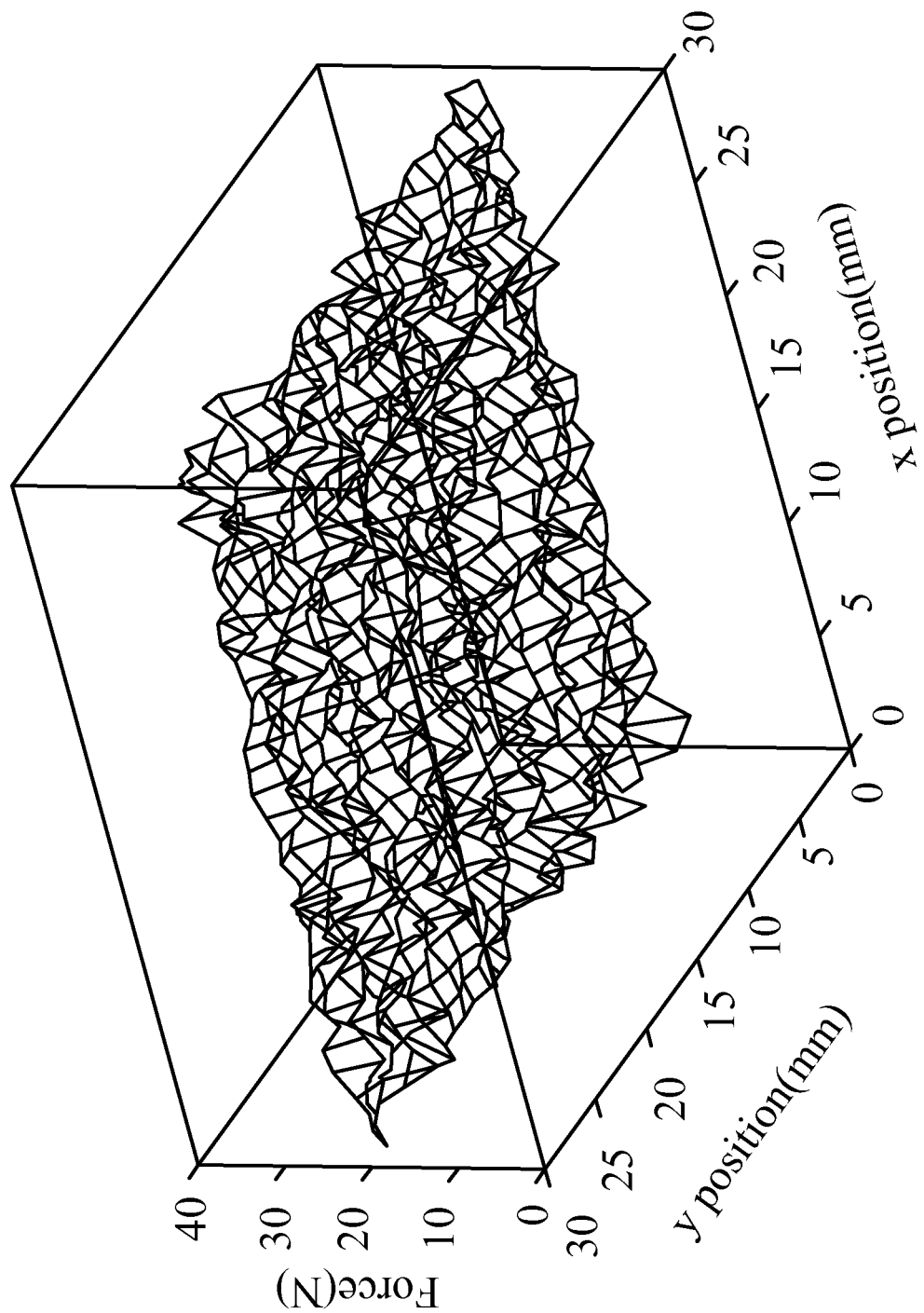
FIGS. 6A-6C are views illustrating a thrust measurement in the vertical direction versus position for input current q-axis magnitudes in the present invention.
Figure 6B:
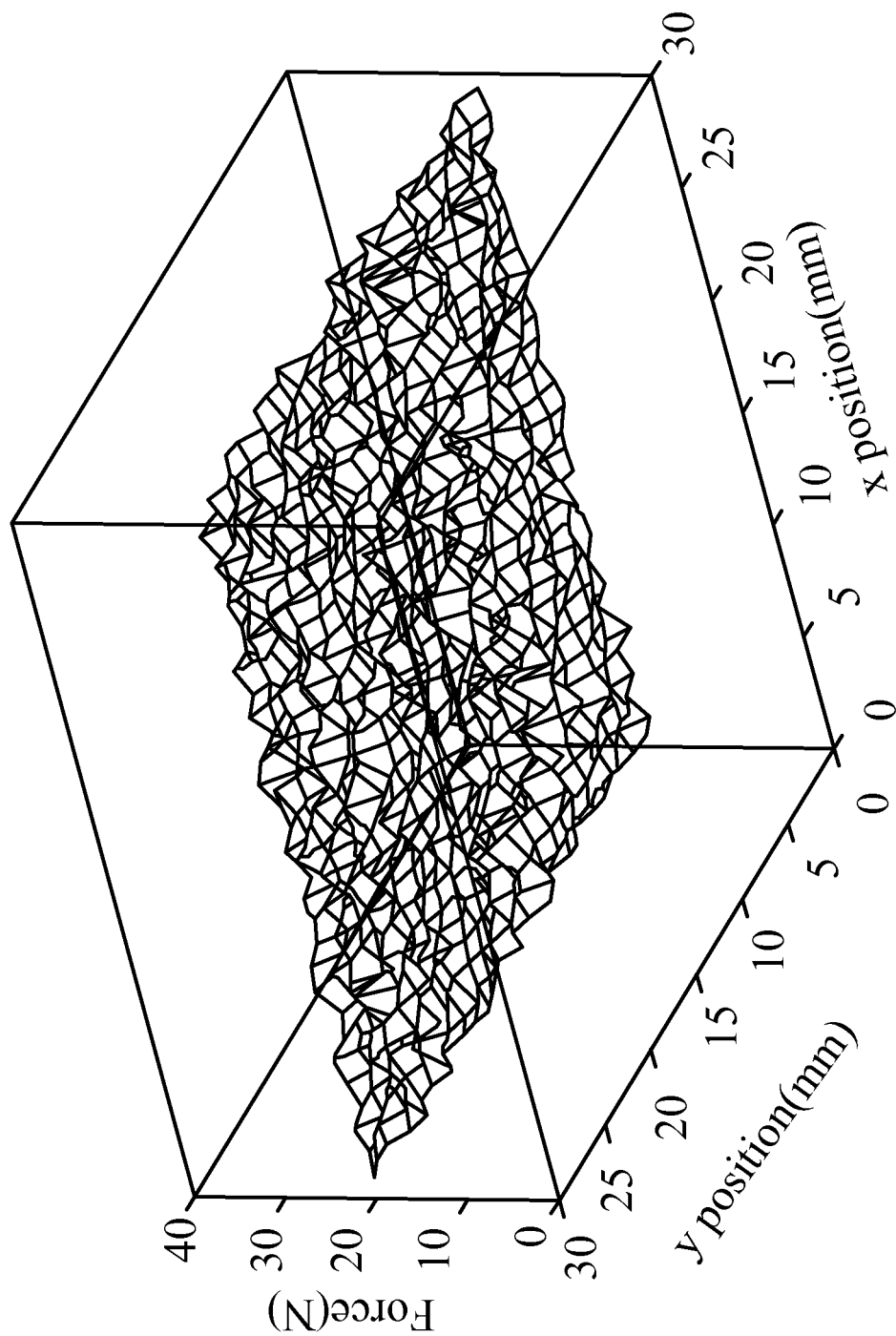
Figure 6C:
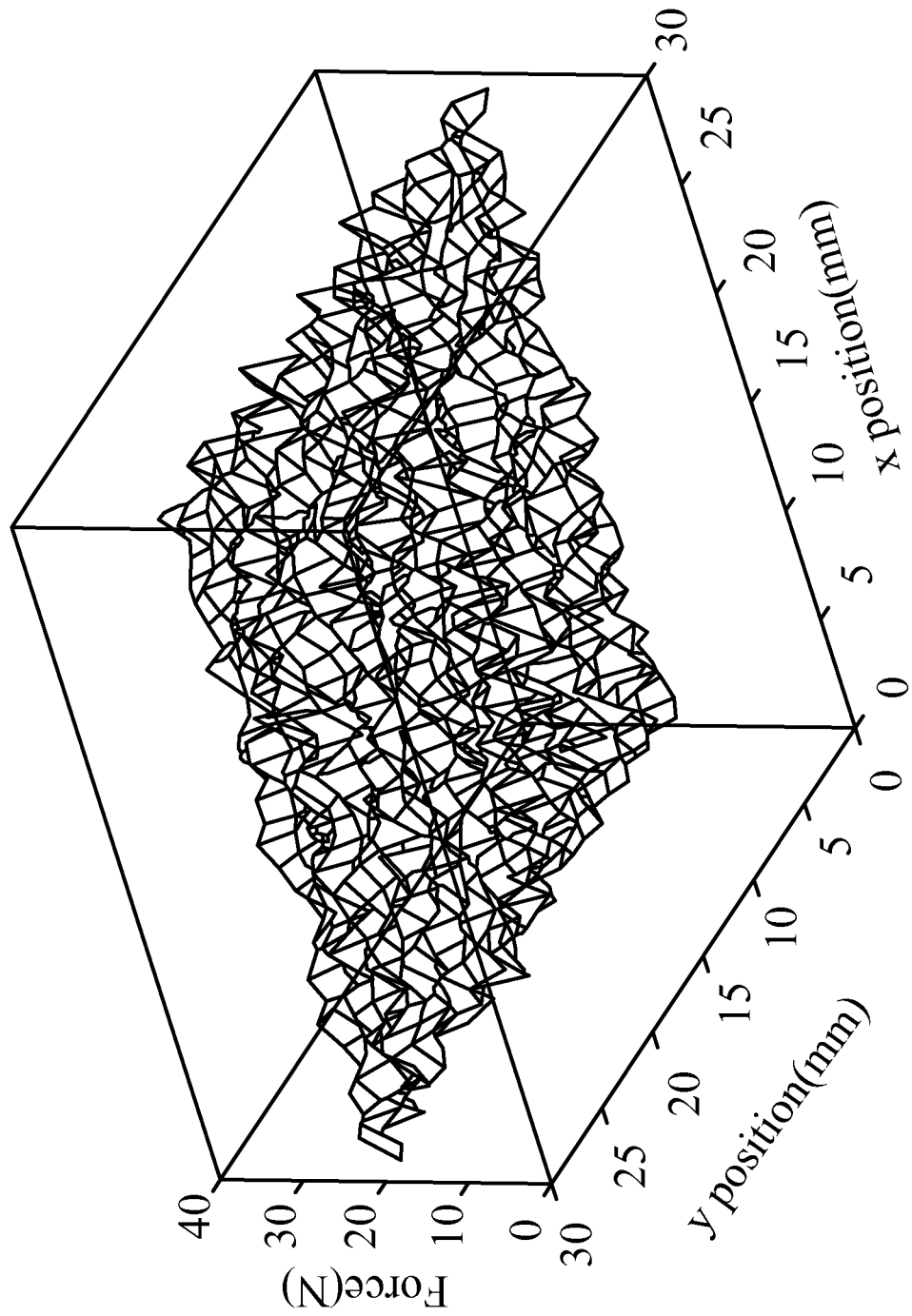
Figure 7A:
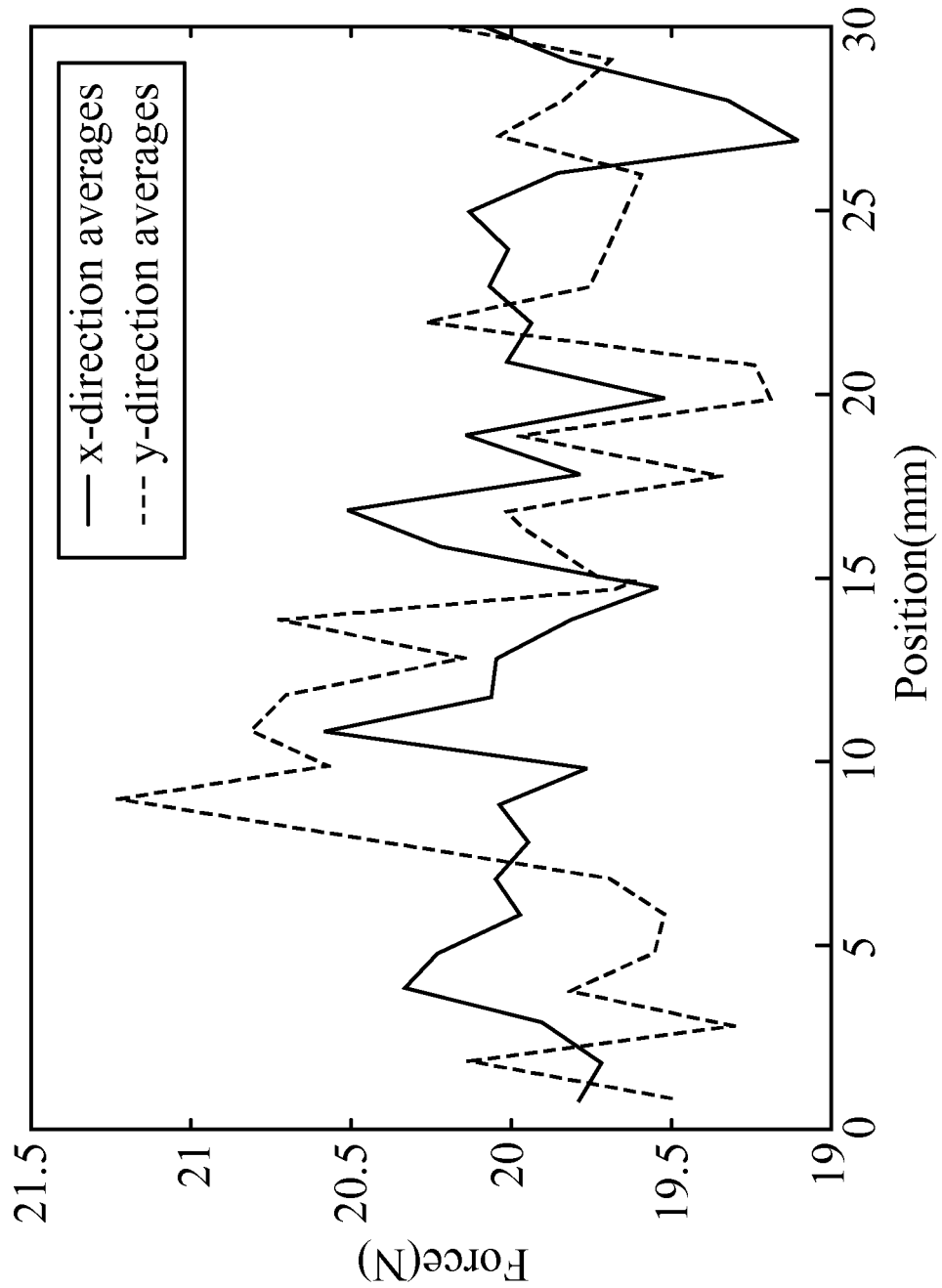
FIGS. 7A-7C are views illustrating the force measurement in the vertical direction and the horizontal direction averages corresponding to average cross sections of measured values.
Figure 7B:
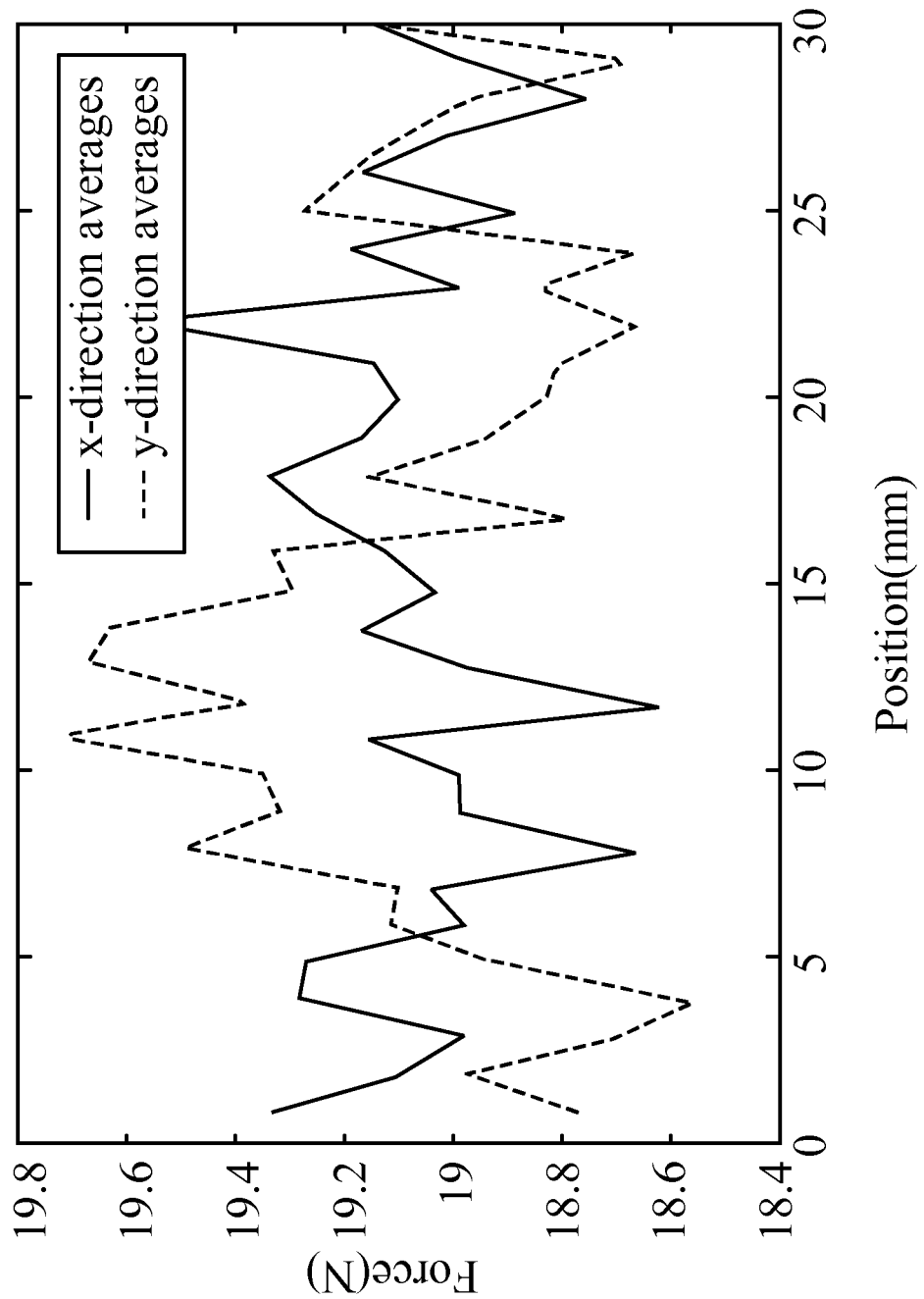
Figure 7C:
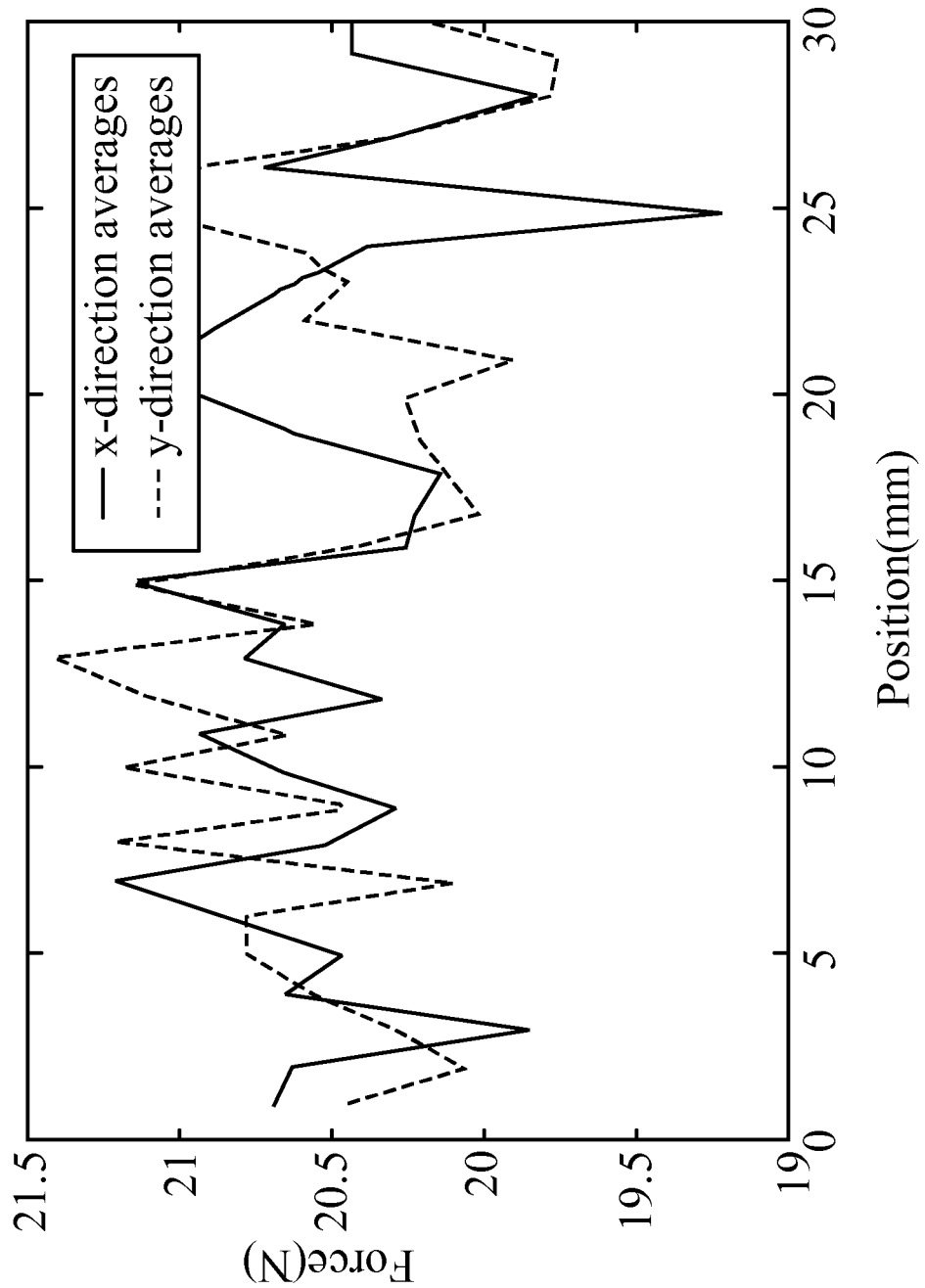

Results for the thrust measurement oriented in the y-direction for three different initial starting positions and at input current q-axis magnitudes of 1.2 amps, 1.8 amps, and 2.4 amps are respectively shown in FIG. 6A, FIG. 6B and FIG. 6C. Variation in measured thrust was observed over the range of motion, and average thrust force increased with greater input current q-axis magnitudes as expected. In order to better observe underlying patterns and distinguish trends from noise, each row of data points in x and y was averaged for all three plots to examine the average cross-section, in both x- and y-directions, for each plane of points. The results are shown in FIG. 7A FIG. 7B and FIG. 7C. Averaging rows of points illustrates the tendency for the cross-sections in x, where the viewpoint of the observer is parallel to the direction of motion and active motor alignment, to display no overarching pattern and remain relatively flat across the given range. However, cross-sections in y, with the viewpoint of the observer oriented perpendicular to the direction of motion and motor alignment, appear to vary over each sampling range. Disregarding noise, a pattern appears that may be harmonic. The data illustrates the tendency for linear motor coils to generate wavelike ripples that affect the magnet as it travels in the direction of motion but not in the perpendicular direction.

Figure 8A:
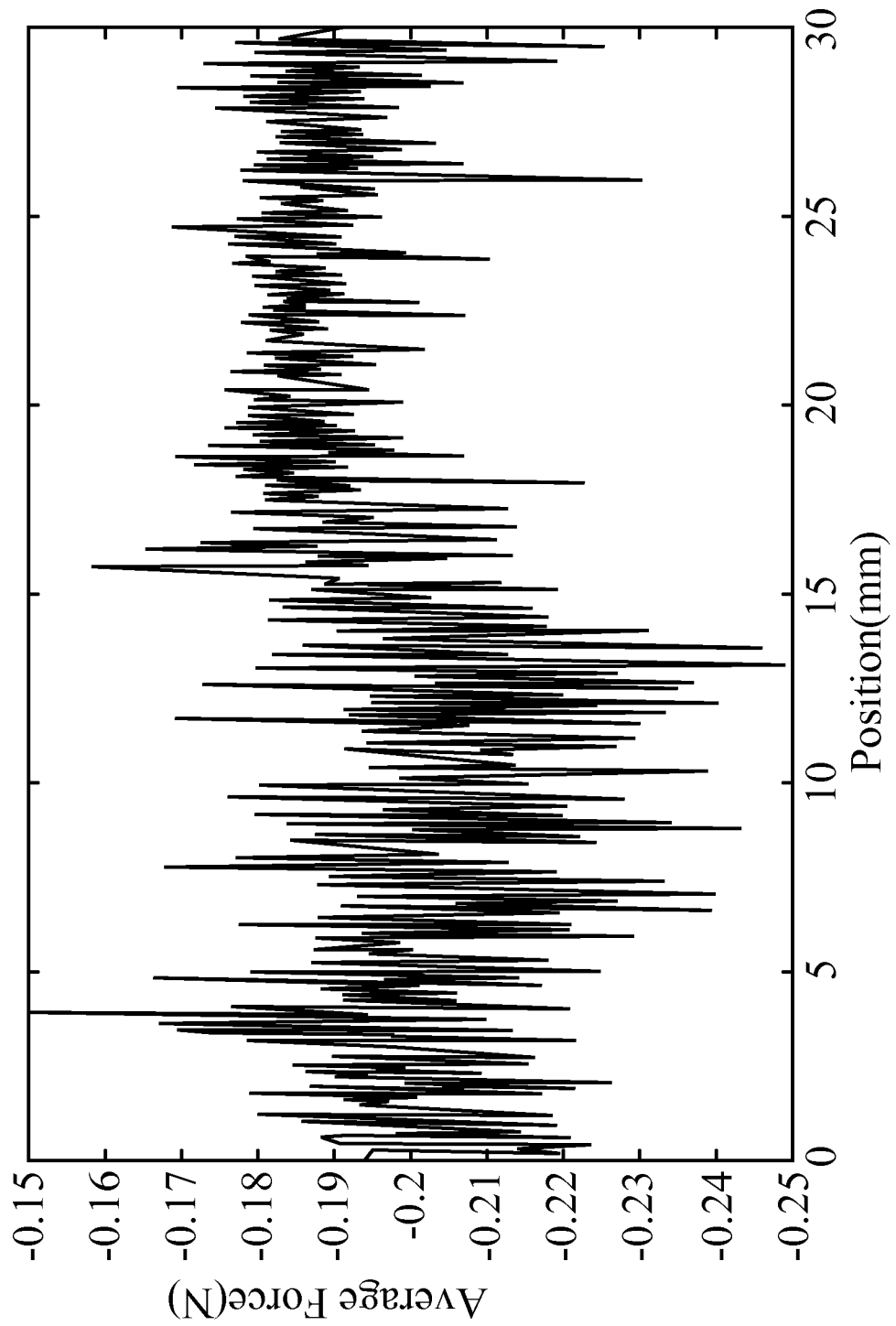
FIGS. 8A-8C are views illustrating an average force measured versus position, with samples taken using single-lines of points showing cross-sections in the horizontal direction.
Figure 8B:
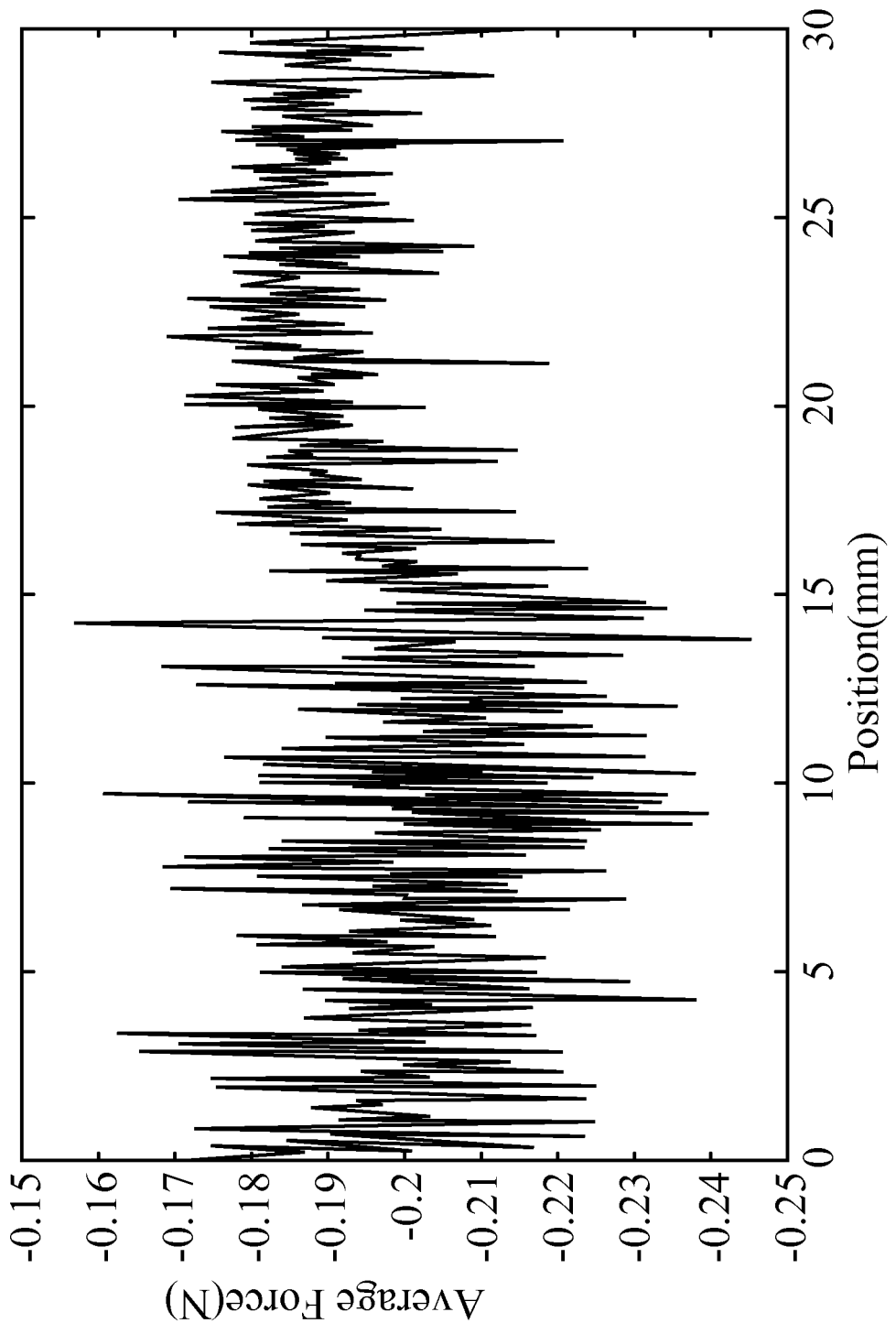
Figure 8C:
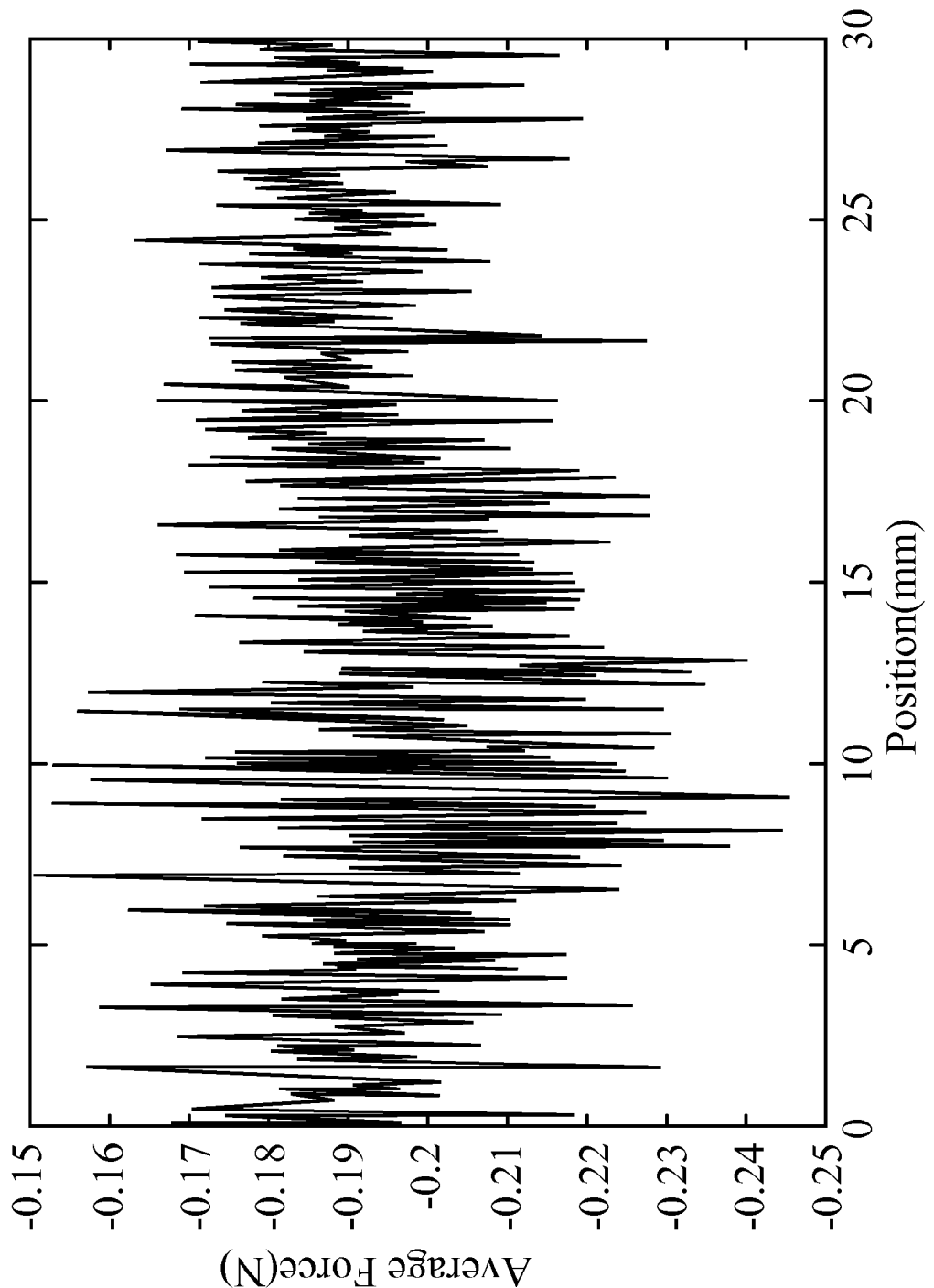

The high-resolution data sampling single lines of points to provide cross-sections in y, with motion and active motor alignment in the y-direction, are shown in FIG. 8A-FIG. 8C. An "average force" on the y-axis is the difference between an initial preload applied to the load cell and a measured thrust when a current is applied. These figures further support the case for a form of harmonic variation in the direction of motion: despite variation in individual samples, the figures demonstrate a clear overall observable pattern. As the samples were taken at x-positions varying by 5 millimeters along the same y-cross section, the data support the assumption of position-dependence in the direction of motion even in two dimensions, as the shape of all three plots is similar and possibly demonstrates a form of harmonic variation over the range. Previous work makes the assumption of position-dependent thrust ripple, and these results further justify this assumption by showing wavelike variation in force caused by the thrust ripple. Despite the overarching patterns, the higher-resolution sampling still indicates relatively large inconsistencies from point to point, which can be attributed to measurement errors.

Figure 9:
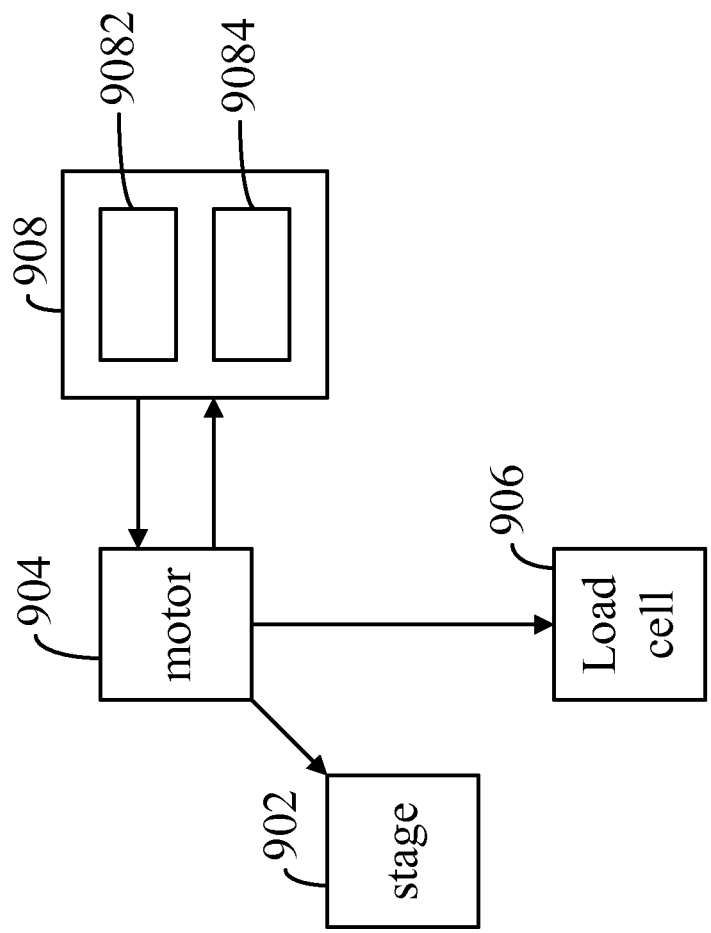
FIG. 9 is a view illustrating a thrust ripple mapping system in the preferred embodiment of the present invention.

FIG. 9 is a block diagram illustrating a thrust ripple mapping system in the preferred embodiment of the present invention. The thrust ripple mapping system 90 includes a moving stage 902, a plurality of motors 904, a load cell 906 and a processing component 908. The load cell 906 is coupled to the moving stage 902. The motors 904 were employed in moving the moving stage 902 and the load cell 906 in increments $\Delta x$ along the entire range of motion in the x-direction, with the processing component 908 taking a thrust force measurement at each increment with the load cell 906. At the completion of an x-row of data points, additional motors 904 were used to move the load cell one increment $\Delta y$ in the y-direction such that the process could be repeated, ultimately resulting in y-oriented thrust measurements at equally spaced increments over the entire range of travel. Specifically, the processing component 908 includes a controller 9082 and an analyzer 9084. The controller 9082 was employed in sending input commands to some of the motors 904 (such as step motors) and sending current commands to the driver of the motors 904 (such as linear motors) in applying continuous force. The analyzer 9084 was employed in taking and storing a thrust force measurement in each increment. The thrust ripple mapping system 90 in the present invention further includes control software written in C programming that would allow users to vary the number of the moving increments over the range of travel in the horizontal direction and the vertical direction, the moving distance and the input current to the linear motors. In a different embodiment, the thrust ripple mapping system 90 in the present invention includes an operating component configured to automate the entire process, allowing the measurement of an entire plane of points with variable length, width, and spacing from start to finish with no user intervention. The operating component can be software written in any computer languages. The result of the motor thrust force measurement was shown in FIG. 6 and FIG. 7. According to the drawing of the result of the motor force thrust measurement, the thrust ripple is mapped on the drawings and the user can realize the thrust ripple in the embodiment of the present invention and the thrust force can be compensated in accordance with the thrust ripple by modifying the input current to control stage position.

An innovative mechanism was designed and built for the direct measurement of thrust ripples in two dimensions over the operating range of a precision planar stage driven by two pairs of PMLSMs. The device measured the thrust exerted by the stage in a single dimension across the entire planar range of motions and the variation of thrust with position input q-axis current magnitude. This was achieved by aligning two linear guides and a load cell with the stage, and restricting the device to alone motion in one direction; applying current to move the stage in the direction of the load cell, also using stepper motors to move the entire assembly and automatically gather data over the stage's two-dimensional travel range. Thrust ripples were found to vary over the plane in the direction of motion but not in the direction perpendicular to the motion, supporting the common assumption of a position-dependent thrust ripple in the implementation of PMLSMs. Results represent, to our knowledge, the first direct measurement of thrust ripples over a planar stage's range of motion. The kind of system described may be used to identify unique thrust ripples for a given system in order to incorporate results directly into the control algorithm, minimizing negative effects of ripple caused by current within motor coils in PMLSM-driven devices.

As described above, the present invention has been described with preferred embodiments thereof and it is understood that many changes and modifications to the described embodiments can be carried out without departing from the scope and the spirit of the invention that is intended to be limited only by the appended claims.

What is claimed is:

1. A thrust ripple mapping system in a precision stage, the thrust ripple induced by at least one motor and the thrust ripple mapping system comprising:
    a moving stage;
    a load cell coupled to the moving stage;
    at least one motor employed in moving the load cell and the moving stage; and
    a processing component taking a thrust force measurement in each of a plurality of moving increments within a moving distance of the load cell;
    wherein the moving stage is a two-axis precision stage; and
    wherein the processing component takes the thrust force measurement in each of the moving increments by restricting motion of the moving stage in at least one of a vertical direction and a horizontal direction.

2. The thrust ripple mapping system according to claim 1, wherein the processing component comprises:
    a controller employed in sending input commands to at least one motor and sending current commands to a driver of the at least one motor in applying continuous force; and
    an analyzer employed in taking and storing the thrust force measurement in each of the moving increments.

3. The thrust ripple mapping system according to claim 2, wherein the thrust ripple mapping system is to compensate the thrust force according to the thrust force measurement in each of the moving increments.

4. The thrust ripple mapping system according to claim 1, further comprising two linear guides for restricting motions of the moving stage in at least one of the vertical direction and the horizontal direction.

5. The thrust ripple mapping system according to claim 1, wherein the at least one motor is a linear motor.

6. The thrust ripple mapping system according to claim 1, further comprising control software allowing users to vary the number of the moving increments over the range of travel in at least one of the horizontal direction and the vertical direction, the moving distance of the load cell and an input current to the at least one motor.

* * * * *